United States Patent
Baek et al.

(10) Patent No.: US 7,759,716 B2
(45) Date of Patent: Jul. 20, 2010

(54) SEMICONDUCTOR DEVICE, METHOD OF FABRICATING THE SAME, STACKED MODULE INCLUDING THE SAME, CARD INCLUDING THE SAME, AND SYSTEM INCLUDING THE STACKED MODULE

(75) Inventors: Seung-Duk Baek, Gyeonggi-do (KR); Sun-Won Kang, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 34 days.

(21) Appl. No.: 12/116,150

(22) Filed: May 6, 2008

(65) Prior Publication Data

US 2009/0001367 A1  Jan. 1, 2009

(30) Foreign Application Priority Data

Jun. 28, 2007  (KR) ...................... 10-2007-0064591

(51) Int. Cl.
 *H01L 27/108* (2006.01)
 *H01L 29/94* (2006.01)
 *H01L 27/088* (2006.01)
 *H01L 31/113* (2006.01)

(52) U.S. Cl. .................. 257/300; 257/261; 257/262; 257/296; 257/393

(58) Field of Classification Search .................. 257/260, 257/261, 296, 300, 393
See application file for complete search history.

(56) References Cited

U.S. PATENT DOCUMENTS 6,469,923 B1 * 10/2002 Hidaka ...................... 365/149

2006/0006516 A1 * 1/2006 Funaba et al. ............... 257/686

FOREIGN PATENT DOCUMENTS

JP  2001-024151  1/2001

(Continued)

OTHER PUBLICATIONS

S.M. Sze "Semiconductor Devices. Physics and Technology", 2nd edition, (C) John Wiley and Sons, pp. 510-511.*

(Continued)

*Primary Examiner*—N Drew Richards
*Assistant Examiner*—Sergey Alekseyev
(74) *Attorney, Agent, or Firm*—Muir Patent Consulting, PLLC

(57) ABSTRACT

A semiconductor device in which a plurality of chips can be reliably stacked without reducing integration thereof. The semiconductor device includes a substrate on which a circuit is provided. Pads are disposed on the substrate for testing the circuit. At least one terminal is provided on the substrate. First conductors are used to electrically couple the pads and the circuit. Second conductors are used to electrically couple the at least one terminal and the circuit. A switching element is disposed in the middle of the first conductors to control the electrical connection between the pads and the circuit. A plurality of semiconductor devices may be stacked on top of one another to form a stacked module, wherein chip selection lines are formed, which extend to the bottom of each of the semiconductor devices to electrically couple chip selection terminals from among the at least one terminal of the semiconductor devices.

20 Claims, 5 Drawing Sheets

FOREIGN PATENT DOCUMENTS

| | | |
|---|---|---|
| JP | 2001-307057 | 11/2001 |
| JP | 2002-141383 | 5/2002 |
| JP | 2003-264240 | 9/2003 |
| JP | 2006-165073 | 6/2006 |
| KR | 2002-0066095 | 8/2002 |

OTHER PUBLICATIONS

English language abstract of Japanese Publication No. 2001-024151.
English language abstract of Japanese Publication No. 2001-307057.
English language abstract of Japanese Publication No. 2002-141383.
English language abstract of Japanese Publication No. 2006-165073.

* cited by examiner

SEMICONDUCTOR DEVICE, METHOD OF FABRICATING THE SAME, STACKED MODULE INCLUDING THE SAME, CARD INCLUDING THE SAME, AND SYSTEM INCLUDING THE STACKED MODULE

CROSS-REFERENCE TO RELATED PATENT APPLICATION

This application claims the benefit of Korean Patent Application No. 10-2007-0064591, filed on Jun. 28, 2007, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a semiconductor device having a switching element installed between a circuit and pads, a stacked module including the semiconductor device, a card including the semiconductor device, and a system which include the stacked module.

2. Description of the Related Art

To satisfy the high integration requirement of semiconductor products, a plurality of semiconductor devices can be stacked in chips or packages. In such a stacked structure, semiconductor devices can be individually selected, or when necessary, can be collectively selected. Chip selection signal lines can be disposed to be electrically coupled to the semiconductor devices respectively, and input/output (I/O) signals can be shared by the semiconductor devices.

For example, Japanese Patent Laid-Open Publication No. 2001-024151 discloses a semiconductor device with a plurality of stacked chips. The plurality of chips can be coupled through a top surface select pad, a bottom surface select pad, and vias. As another example, Japanese Patent Laid-Open Publication No. 2006-165073 discloses a method of stacking chips using a conductive paste burying a through hole formed in a silicon chip.

However, it is difficult to form a plurality of vias or to spread a plurality of conductive pastes on high-density semiconductor devices evenly without contacting other circuits. Particularly, allotting an additional area for connecting chip selection signal lines within the semiconductor devices negatively impacts the integration density of the semiconductor devices. Furthermore, achieving reliable insulation between the pads coupled to the chip selection signal line and other circuits is difficult.

SUMMARY OF THE INVENTION

Example embodiments of the present invention provide a semiconductor device in which a plurality of chips can be reliably stacked without reducing the integration thereof.

The present invention also provides a method of manufacturing the semiconductor device.

The present invention also provides a stacked module including the semiconductor device.

The present invention also provides a card including the semiconductor device and a system including the stacked module.

According to an aspect of the present invention, there is provided a semiconductor device. The semiconductor device includes a substrate, and a circuit is provided on the substrate. Also, at least one pad and at least one terminal are provided on the substrate. At least one first conductor, such as a wire, may electrically couple the at least one pad and the circuit. At least one second conductor may electrically couple the at least one terminal and the circuit. Moreover, a switching element may be disposed substantially in the middle of the at least one first conductor, the at least one switching element being configured to control electrical signals transmitted between the at least one pad and the circuit.

According to an embodiment of the semiconductor device of the present invention, the least one terminal includes a chip selection terminal configured to transmit a chip selection signal to the circuit, and the at least one pad is used to test the circuit. Furthermore, at least one first through electrode passes through the at least one pad and the substrate and is insulated from the at least one pad.

According to another embodiment of the semiconductor device of the present invention, the switching element can disconnect electric connections between the at least one pad and the circuit after the circuit is tested.

According to another embodiment of the semiconductor device of the present invention, the at least one terminal includes at least one input/output (I/O) terminal, and at least one second through electrode which passes through the at least one I/O terminal and the substrate and is electrically coupled to the at least one I/O terminal.

According to another aspect of the present invention, there is provided a stacked module. A plurality of semiconductor devices according to the previously described embodiments is stacked on each other. Then, a plurality of chip selection lines may be electrically coupled to chip selection terminals from among the at least one terminal of each of the plurality of semiconductor devices, and extended to the bottom of each of the plurality of semiconductor devices.

In an embodiment of the stacked module according to the present invention, at least one I/O line can be can be commonly coupled to the at least one I/O terminal corresponding to each of the semiconductor substrates, and can be extended to the bottom of the semiconductor devices.

According to another aspect of the present invention, there is provided a method of manufacturing a semiconductor device. At least one pad and at least one terminal may be formed on a substrate. At least one first conductor, electrically coupling the at least one pad and the circuit, may be installed between the at least one pad and the circuit, and a switching element is placed on the at least one first conductor. At least one second conductor may be formed to electrically couple the at least one terminal and the circuit. The circuit may be tested using the at least one pad. After testing the circuit, the switching element may be turned off to disconnect the electrical connection between the circuit and the at least one pad. Then, at least one first through electrode may be formed passing through the at least one pad and the substrate, and insulated from the at least one pad.

According to another aspect of the present invention, there may be provided a card. A memory of the card can be composed of any one of the semiconductor device or the stacked modules. Also, a controller of the card may control the memory, sending and receiving the data to/from the memory.

According to another aspect of the present invention, there is provided a system. A memory of the system can be composed of any one of the semiconductor device or the stacked modules. A processor of the system may communicate with the memory through a bus. In addition, an I/O device may communicate with the bus.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
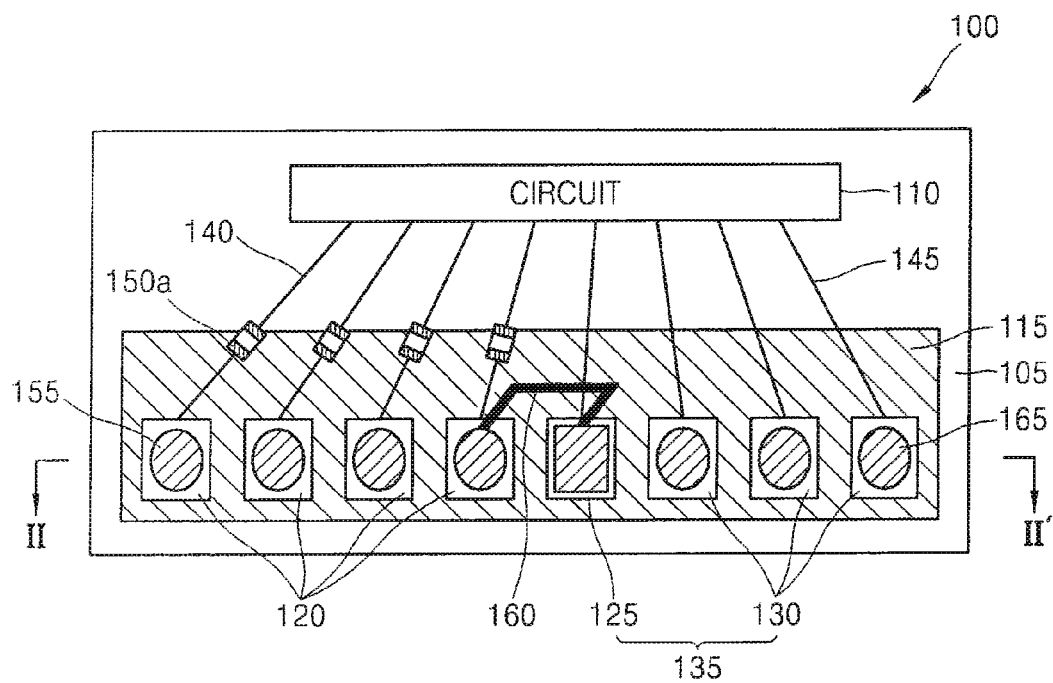
FIG. 1 is a plan view of a semiconductor device according to an embodiment of the present invention.

Hereinafter, the present invention will be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

In the embodiments of the present invention, a semiconductor device may be provided in the form of a semiconductor chip or a semiconductor package.

Figure 2:
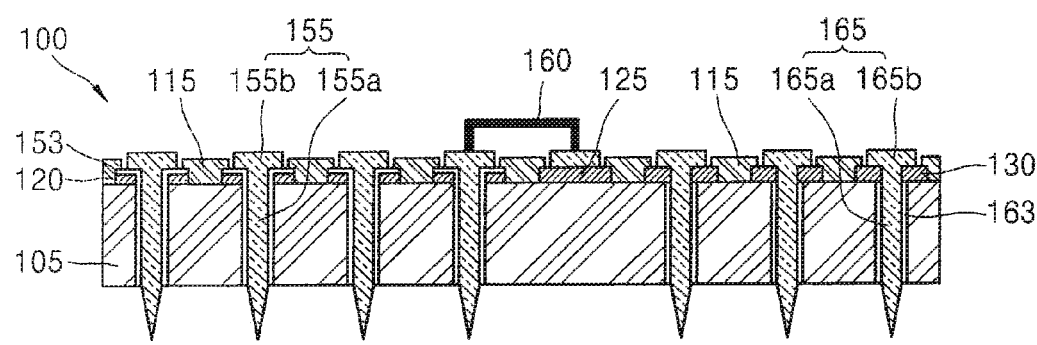
FIG. 2 is a cross-sectional view of the semiconductor device of FIG. 1 cut along line II-II.

FIG. 1 is a plan view of a semiconductor device 100 according to an embodiment of the present invention. FIG. 2 is a cross-sectional view of the semiconductor device 100 of FIG. 1 cut along line II-II.

Referring to FIGS. 1 and 2, a circuit 110 may be provided on a substrate 105. For example, in the case where the semiconductor device 100 is in the form of a semiconductor chip, the substrate 105 may include a semiconductive material such as silicon, germanium, and/or silicon-germanium. However, when the semiconductor device 100 is in the form of a semiconductor package, the substrate 105 may include a semiconductor material on a package substrate.

The circuit 110 can be changed depending on the type of the semiconductor device 100. For example, the circuit 110 may include a logic circuit or a memory circuit. Therefore, the circuit 110 may include an array of transistors, capacitors, and/or resistors on the substrate 105, but the present invention is not limited thereto.

At least one pad, for example a plurality of pads 120 may be provided on the substrate 105. The pads 120 may be used only before the semiconductor device 100 is packaged. For example, the pads 120 may be used to test the semiconductor device 100 or the circuit 110.

At least one first conductor (such as a wire)—for example a plurality of first conductors 140 may be provided on the substrate 105 to electrically couple the circuit 110 to the pads 120. For example, the pads 120 may be disposed higher than the circuit 110, and an interlayer insulation layer (not shown) may be interposed between the circuit 110 and the pads 120. The first conductors 140 may include parts disposed vertically to the substrate in order to couple the circuit 110 and the pads 120. For example, the first conductors 140 may be electrically coupled to a transistor, a capacitor, and/or a resistor of the circuit 110. However, the present invention is not limited to such configuration.

For example, the pads 120 may be used as a probing pad when testing the semiconductor device 100 or the circuit 110. For example, before the semiconductor device 100 is packaged, the pads 120 may be used for electrical die sorting (EDS) tests to validate the reliability of the circuit 110; however, the present invention not limited thereto. Simply, the pads 120 may no longer be needed after testing the circuit 110.

At least one switching element, for example a plurality of switching elements 150a may be disposed in substantially the middle part of the first conductors 140. The switching elements 150a can control electrical connections between the circuit and the pads 120. In FIG. 1 the switching elements 150a are turned off, therefore the circuit 110 and the pads 120 are electrically disconnected.

In one example embodiment, the switching elements 150a may include a fuse. As another example, the switching elements 150a may be an electric circuit such as a transistor. The switching elements 150a may be disposed closer to the pads 120 than to the circuit 110 in order to increase the controlling efficiency.

At least one terminal may be provided on the substrate 105 to be electrically coupled to the circuit 110. For example, at least one of the terminals 135 may be used in communication with the circuit 110. Specifically, the terminals 135 may include a chip selection terminal 125 and/or at least one input/output (I/O) terminal 130. The chip selection terminal 125 may be provided to select the semiconductor device 100 or the circuit 110, and the I/O terminals 130 may be provided to transfer I/O signals to the semiconductor device 100.

At least one second conductor may be provided on the substrate 105 to electrically couple the terminals 135 and the circuit 110. For example, at least one of a plurality of second conductors 145 may be used in communication with the circuit 110. Specifically, the terminals 135 may be disposed higher than the circuit 110, and an interlayer insulation layer (not shown) may be interposed between the circuit 110 and the terminals 135. In this case, the second conductors 145 may include parts disposed vertically to the substrate in order to couple the circuit 110 and the terminals 135. For example, the second conductors 145 may be electrically coupled to a transistor, a capacitor, and/or a resistor of the circuit 110. However, the scope of the present invention is not limited thereto.

At least one first through electrode, for example a plurality of first through electrodes 155 may be disposed to pass through a portion of the substrate 105, and at least one second through electrode, for example a plurality of second through electrodes 165 may be disposed to pass through the other portion of the substrate 105. For example, the first through electrodes 155 may pass through the pads 120 and portions of the substrate 105 existing under the pads 120, and the second through electrodes 165 may pass through the I/O terminals 130 and the substrate 105 placed under the I/O terminals 130. For example, the first through electrodes 155 may include a first recessing portion 155a passing through the substrate 105 and a first re-wiring portion 155b on the substrate 105. The first re-wiring portions 155b may extend the first through electrodes 155 to the top of the substrate 105.

The first through electrodes 155 may be insulated from the substrate 105 and the pads 120. For example, a spacer insulation layer 153 may be interposed between the first recessing portion 155a and the substrate 105 and between the first re-wiring portion 155b and the pads 120. A third conductor 160 may electrically couple the first through electrodes 155 and the chip selection terminal 125. Therefore, the pads 120 may only be provided to form at least one through electrode 155, while pads 120 and the through electrode 155 are insulated from each other. The first conductors 140, the second conductors 145, and the third conductor 160 may not touch each other directly.

The first through electrodes 155 may be disposed to pass through the pads 120 that is no longer used after the circuit 110 is tested, and may be electrically insulated from the pads 120. Therefore, without allotting an additional space in the substrate 105, an area where the first through electrodes 155 may be formed can be secured on the substrate 105. As a result, chip selection signal lines can be disposed without reducing the integration of the semiconductor device 100. Moreover, when the pads 120 are disposed in the center of the semiconductor device 100 as in high-speed DRAM, a length of the chip selection signal line passing through the pads 120 can be shortened. Therefore, use of the semiconductor device 100 can be advantageous in high-speed operations.

Furthermore, the pads 120 and the first through electrodes 155 may be double-insulated. First, the spacer insulation layer 153 can insulate the pads 120 and the first through electrodes 155. Second, even if there is a current leak between the pads 120 and the first through electrodes 155, the switching element 150a when turned off can prevent direct connection of the first through electrodes 155 and the circuit 110. As a result, mutual interference between chip selection signals passing through the first through electrodes 155 and test signals passing through the pads 120 can be prevented. Therefore, noise from the semiconductor device 100 can be reduced, and reliability thereof can be improved.

Each second through electrodes 165 may include a second recessing portion 165a passing through the substrate 105 and second rewiring portions 165b on the substrate 105. The second rewiring portions 165b may play a role in extending the second through electrodes 165 above the substrate 105. The second through electrodes 165 may be electrically coupled to the I/O terminals 130. For example, the second recessing portion 165a can be insulated from the substrate 105 by spacer insulation layers 163, but the second rewiring portions 165b may be in direct contact with the I/O terminals 130. Therefore, the second through electrodes 165 may play a role in extending the I/O terminals 130 to the lower part of the substrate 105.

A passivation layer 115 may be provided on the substrate 105 to expose the pads 120 and the I/O terminals 135. The passivation layer 115 may be disposed to further cover the circuit 110. Furthermore, the passivation layer 115 may also cover, either partially or entirely, the first conductors 140, the second conductors 145, and the third conductor 160.

Figure 3:
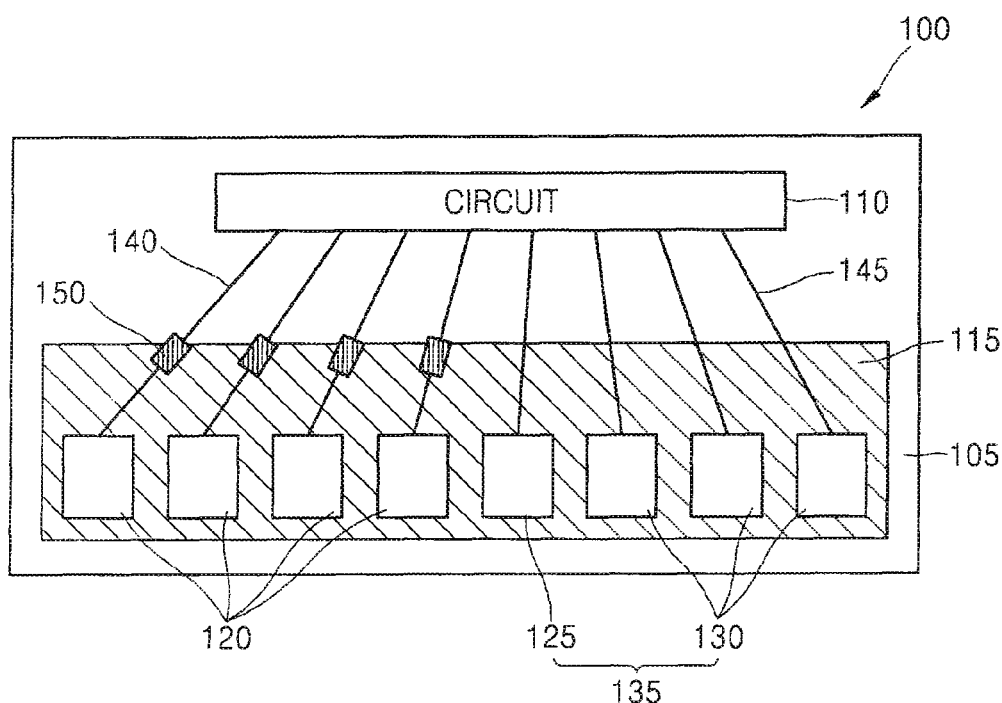
FIGS. 3 to 5 are plan views for explaining a method of manufacturing the semiconductor device illustrated in FIGS. 1 and 2, according to an embodiment of the present invention.
Figure 4:
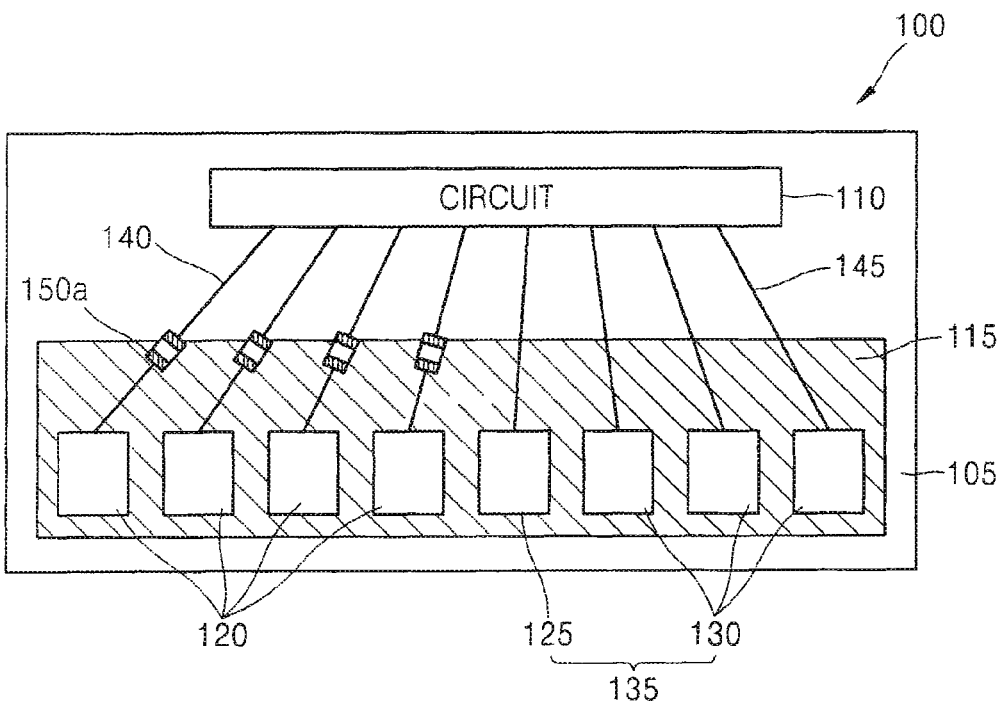
Figure 5:
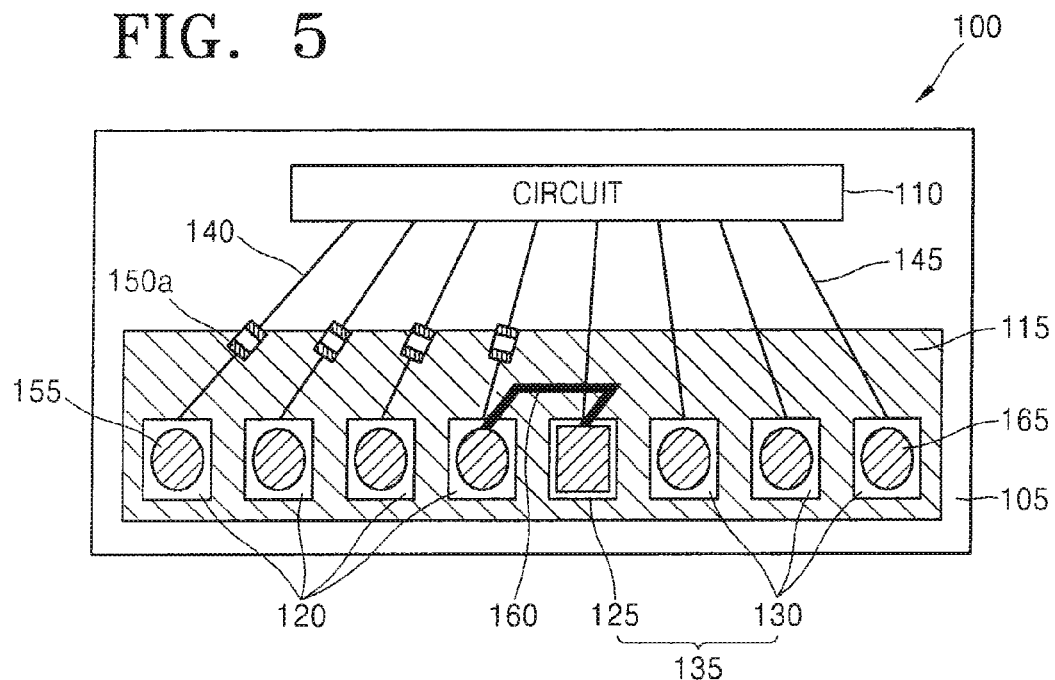

FIGS. 3 to 5 are plan views for explaining a method of manufacturing the semiconductor device 100 according to an embodiment of the present invention.

Referring to FIG. 3, the circuit 110, the pads 120, and the I/O terminals 135 may be formed on the substrate 105. The first conductors 140 coupling the pads 120 and the circuit 110 may be formed on the substrate 105, and the second conductors 145 coupling the terminals I/O 135 and the circuit 110 may be formed on the substrate 105. The switching elements 150 may be disposed in substantially the middle of the first conductors 140. When the switching elements 150 are in an "on" state, the pads 120 may be electrically coupled to the circuit 110.

For example, the circuit 110 is formed on the substrate 105. Then, a conductive layer (not shown) is formed on the circuit 110, and the conductive layer is patterned to form the pad 120 and the terminals I/O 135. The first and second conductors 140 and 145 may be formed before the pads 120 and the terminals 135 are formed. However, in another embodiment of the present invention, the first and the second conductors 140 and 145, the pads 120, and the terminals I/O 135 may be formed in any order including a random order. Next, the circuit 110 may be tested using the pads 120. For example, EDS tests may be carried out using the pads 120 as probing pads in order to validate the reliability of the circuit 110.

Referring to FIG. 4, the switching elements 150a may be turned off after testing the circuit 110. For example, when the switching elements 150a include a fuse, the switching elements 150a can be turned off by disconnecting the fuse. For instance, the fuse can be disconnected by laser irradiation. Accordingly, the circuit 110 and the pads 120 can be electrically disconnected from each other. As a result, a leakage current entering the pads 120 does not affect the circuit 110.

Referring to FIG. 5, the first through electrodes 155 passing through the pads 120 and the substrate 105 under the pads 120 may be formed. For example, the first through electrodes 155 may be formed to fill holes (not shown) previously formed in the pads 120 and the substrate 105. A spacer insulation layer 153 may be formed inside the holes and on the pads 120 before the first through electrodes 155 are formed. Accordingly, a connection between the first through electrodes 155 and the pads 120, and a connection between the first through electrodes 155 and the substrate 105 may be insulated.

The second through electrodes 165 passing through the I/O terminals 130 and the substrate 105 under the I/O terminals 130 may be formed. For example, the second through electrodes 165 may be formed to fill the holes (not shown) passing through the I/O terminals 130 and the substrate 105. A spacer insulator 163 may be formed within the holes before the second through electrodes 165 are formed, thereby insulating the second through electrodes 165 from the substrate 105. However, since the spacer insulation layer 163 does not extend above the I/O terminals 130, the second through electrodes 165 may be in direct contact with the I/O terminals 130.

The first through electrodes 155 and the chip selection terminal 125 may be electrically coupled using the third conductor 160. When the chip selection terminal 125 is electrically coupled to the third conductor 160, the switching elements 150a are turned off. Therefore, even if a current leak occurs between the first through electrodes 155 and the pads 120, the chip selection signals are not transmitted immediately to the circuit 110 through the first conductors 140. As a result, in spite of the pads 120 being used as areas on which the first through electrodes 155 are formed, test signals passing through the pads 120 and the chip selection signals passing through the first through electrodes 155 can be reliably separated from each other. The first through electrodes 155, the second through electrodes 165, and the third conductor 160 may be formed in any order including a random order.

Figure 6:
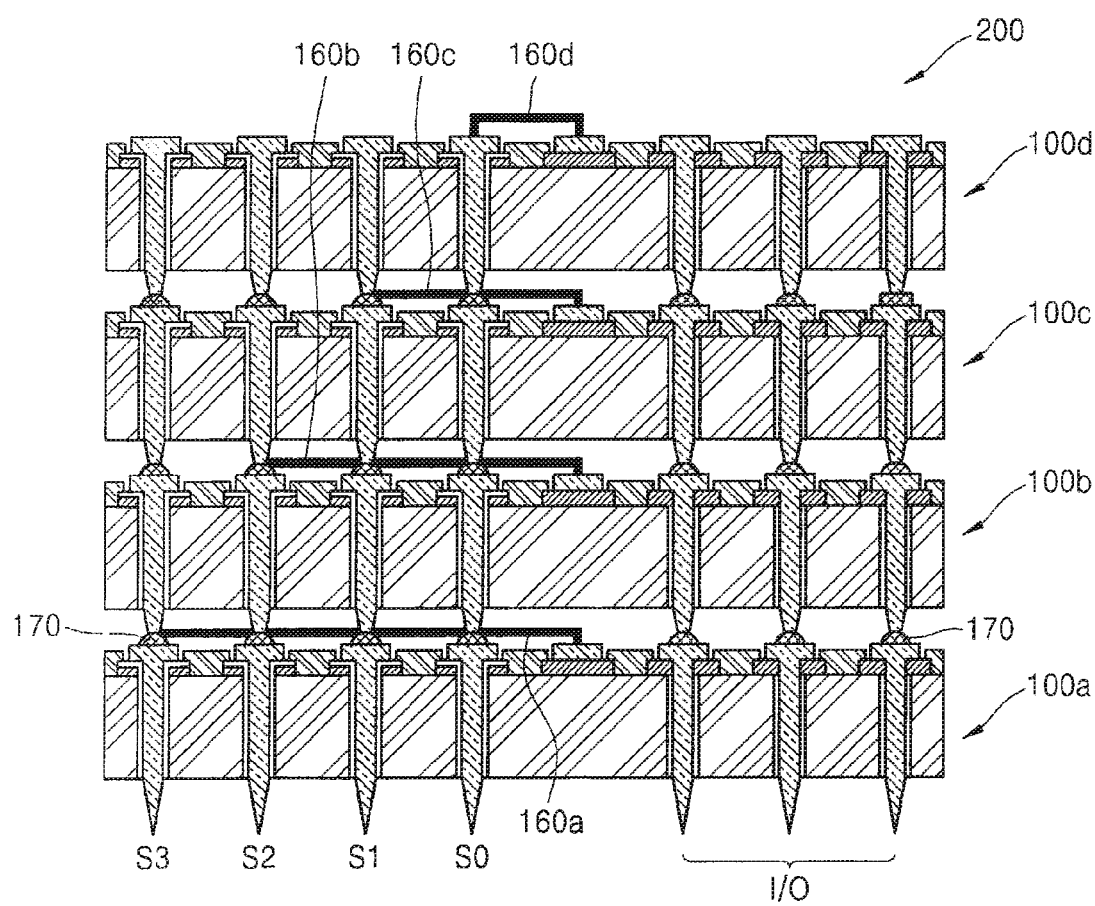
FIG. 6 is a cross-sectional view illustrating a stacked module according to an embodiment of the present invention.

FIG. 6 is a cross-sectional view illustrating a stacked module 200 according to an embodiment of the present invention. Referring to FIG. 6, a plurality of semiconductor devices 100a, 100b, 100c, and 100d may be stacked sequentially. Each of the semiconductor devices 100a, 100b, 100c, and 100d corresponds to the semiconductor device 100 of FIG. 1.

However, third conductors 160a, 160b, 160c, and 160d on the semiconductor devices 100a, 100b, 100c, and 100d may each be electrically coupled to the first through electrodes 155 that are in different positions from each other on each of the respective semiconductor devices 100a, 100b, 100c, and 100d. In the stacked semiconductor devices 100a, 100b, 100c, and 100d, the first through electrodes 155 may be electrically coupled to each other using solder balls 170. Likewise, the second through electrodes 165 may be electrically coupled to each other using the solder balls 170.

A plurality of chip selection signal lines S3, S2, S1, and S0 are electrically coupled to the chip selection terminal 125 on each of the semiconductor devices 100a, 100b, 100c, and 100d, and may be extended to the bottom of the semiconductor devices 100a, 100b, 100c, and 100d. The chip selection signal lines S3, S2, S1, and S0 may be used to transfer the chip selection signals to the circuit 110 on each of the semiconductor devices 100a, 100b, 100c, and 100d. That is, each of the chip selection signals can be transmitted through the semiconductor devices 100a, 100b, 100c, and 100d by passing through one of the chip selection signal lines S3, S2, S1, and S0. Therefore, the number of chip selection signal lines S3, S2, S1, and S0 may be equal to the number of semiconductor devices 100a, 100b, 100c, and 100d.

However, in another embodiment of the present invention, some of the semiconductor devices 100a, 100b, 100c, and 100d may share signals, and in this case, the number of chip selection lines S3, S2, S1, and S0 may be less than the number of the semiconductor devices 100a, 100b, 100c, and 100d.

The chip selection signal lines S3, S2, S1, and S0 may pass through the first through electrodes 155 and one of the third conductors 160a, 160b, 160c, and 160d. For example, the chip selection signal line S3 may pass through one of the first through electrodes 155 and the third conductor 160a. As another example, the chip selection signal line S0 pass through four of the stacked first through electrodes 155 and the third conductor 160d.

At least one input/output (I/O) line (indicated by "I/O" in FIG. 6) may be commonly coupled to at least one I/O terminal 130 of each of the semiconductor devices 100a, 100b, 100c, and 100d, and may be extended to the bottom of the semiconductor devices 100a, 100b, 100c, and 100d. For example, the I/O lines (indicated by "I/O" in FIG. 6) may pass through the second through electrodes 165, which are stacked, and the second through electrodes 165 may be electrically coupled using solder balls 170. In the stacked module 200, the configurations of the chip selection lines S3, S2, S1, and S0 and the I/O lines I/O are shown as examples. Therefore, it will be understood by those of ordinary skill in the art that various changes in form and details may be made therein.

Figure 7:
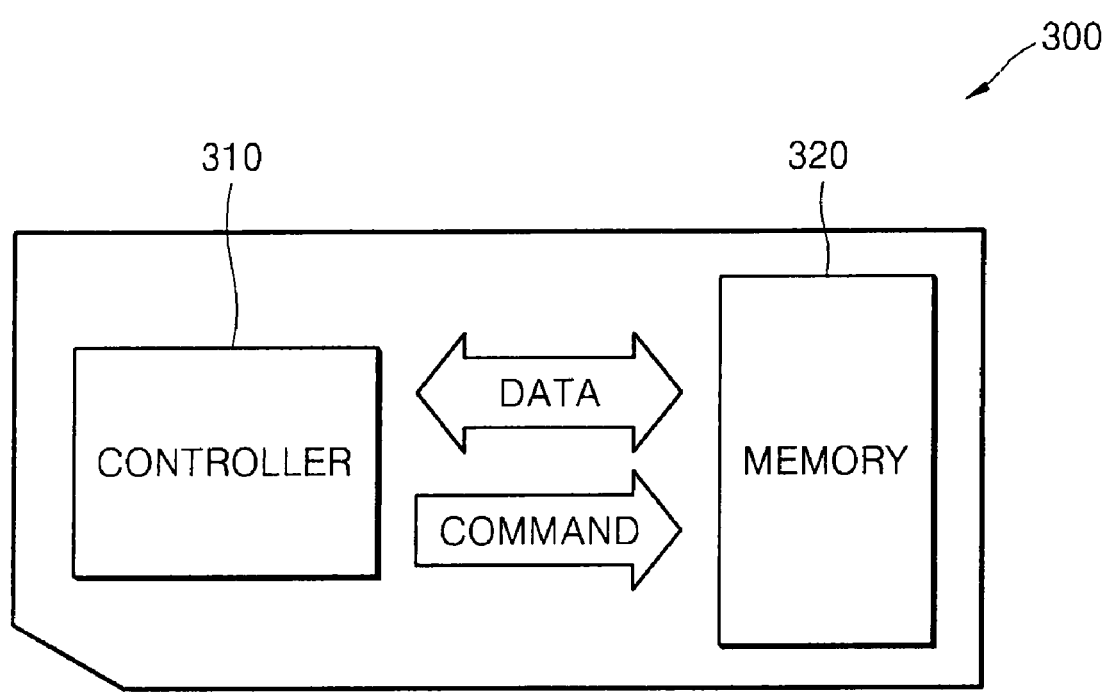
FIG. 7 is a schematic diagram illustrating a card according to an embodiment of the present invention.

FIG. 7 is a schematic diagram illustrating a card 300 according to an embodiment of the present invention. Referring to FIG. 7, a controller 310 and a memory 320 may be disposed to exchange electric signals. For example, when a command is sent from the controller 310, the memory 320 can transfer data to the controller 310. This type of card 300 may be used in memory devices such as multimedia cards (MMC) or secure digital (SD) cards.

The memory 320 may correspond to the semiconductor device 100 of FIG. 1 or the stacked module 200 of FIG. 6. That is, the semiconductor device 100 and the stacked module 200 may be provided as a memory device such as a DRAM, an SRAM, a flash memory and/or a phase-change memory (PRAM).

Figure 8:
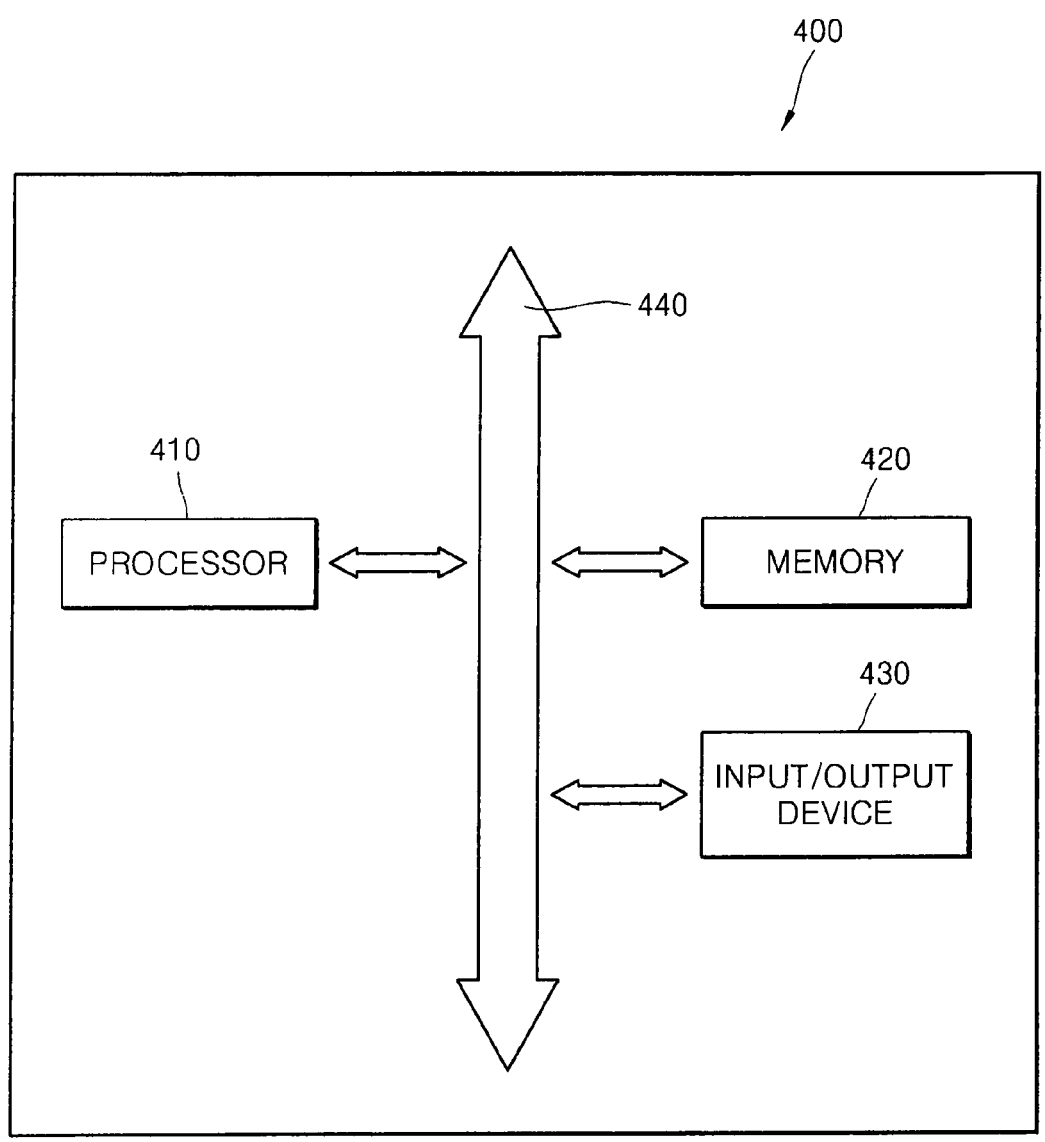
FIG. 8 is a block diagram illustrating a system according to an embodiment of the present invention.

FIG. 8 is a block diagram illustrating a system 400 according to an embodiment of the present invention. Referring to FIG. 8, a processor 410, an I/O device 430, and a memory 420 can communicate data with one another using a bus 440. The processor 410 may play a role in running the program and controlling the system 400. The I/O device 430 may be used in inputting and outputting the data of the system 400.

The memory 420 may correspond to the semiconductor device 100 of FIG. 1 or the stack module 200 of FIG. 6. For example, the memory 420 can save codes and data for the operation of the processor 410. Further, the system 400 may be electrically coupled to an external device, such as a personal computer or a network, using an I/O device 430, and may exchange data with the external device. For example, such system 400 may be used in mobile phones, MP3 players, navigation systems, solid state disks (SSD), or in household appliances, among other possibilities.

According to the semiconductor device of the present invention, an area where the first through electrodes 155 may be formed can be secured within the substrate without allotting an additional space in the substrate 105. As a result, chip selection signal lines may be disposed without negatively impacting the integration density of the semiconductor device. Therefore, the semiconductor according to example embodiments of the present invention advantageously achieves higher integration.

According to the semiconductor device of the present invention, insulation between pads and first through electrodes can be strengthened. Particularly, even in case of a leakage current, a switching element that is turned off can prevent the first through electrodes from being directly coupled to a circuit. Therefore, mutual interference between chip selection signals passing through the first through electrodes and test signals passing through the pads may be prevented, thereby improving the reliability of the semiconductor device.

A semiconductor device according to the present invention may be useful for a stacked module, a card, and a system.

According to some embodiments, a method of manufacturing a semiconductor device may comprise: forming a circuit on a substrate; forming at least one pad and at least one terminal on the substrate; forming first conductors which electrically couple the at least one pad and the circuit, by disposing at least one switching element in between the at least one pad and the circuit; forming second conductors which electrically couple the at least one terminal and the circuit; testing the circuit using the at least one pad; turning off at least one switching element after testing the circuit to disconnect an electrical connection between the circuit and the at least one pad; and forming at least one first through electrode which passes through the at least one pad and the substrate and are insulated from the at least one pad.

According to some embodiments, the method may further comprise forming a third conductor that electrically couples a chip selection terminal of the at least one terminal and one of the at least one first through electrode.

According to some embodiments, each switching element may comprise a fuse, and the switching element is turned off by disconnecting the fuse.

According to some embodiments, the method may further comprise forming at least one second through electrode passing through at least one I/O terminals among the at least one terminal and the substrate, and are electrically coupled to the at least one I/O terminal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a substrate;
   a circuit on the substrate;
   at least one pad on the substrate;
   at least one terminal on the substrate;
   at least one first conductor electrically coupling the at least one pad and the circuit;
   at least one second conductor electrically coupling the at least one terminal and the circuit;
   at least one switching element connected to the at least one first conductor, the at least one switching element being configured to control electrical signals transmitted between the at least one pad and the circuit; and
   at least one first through electrode which passes through the at least one pad and the substrate and is insulated from the at least one pad.

2. The semiconductor device of claim 1, wherein the at least one terminal comprises a chip selection terminal configured to transmit a chip selection signal to the circuit, and the at least one pad is used to test the circuit.

3. The semiconductor device of claim 2, further comprising a third conductor electrically coupling the at least one first through electrode and the chip selection terminal.

4. The semiconductor device of claim 2, wherein the at least one switching element disconnects an electrical connection between the at least one pad and the circuit after the circuit is tested.

5. The semiconductor device of claim 4, wherein each switching element comprises a fuse, wherein the fuse is disconnected after the circuit is tested.

6. The semiconductor device of claim 4, wherein each switching element is disposed closer to the at least one pad than to the circuit.

7. The semiconductor device of claim 1, wherein the at least one terminal comprises at least one input/output (I/O) terminal.

8. The semiconductor device of claim 7, further comprising at least one second through electrode which passes through the at least one (I/O) terminal and the substrate and is electrically coupled to the at least one (I/O) terminal.

9. The semiconductor device of claim 8, further comprising a spacer insulation layer interposed between each second through electrode and the substrate.

10. A stacked module comprising:
    a plurality of semiconductor devices each corresponding to the semiconductor device according to claim 1, which are stacked on top of one another; and
    a plurality of chip selection lines which are electrically coupled to chip selection terminals from among the at least one terminal of each of the plurality of semiconductor devices, and extended to the bottom of each of the plurality of semiconductor devices.

11. The stacked module of claim 10, wherein each of the plurality of chip selection lines pass through a corresponding one of the at least one first through electrodes.

12. The stacked module of claim 11, wherein each of the semiconductor devices further comprises a third conductor electrically coupling one of the at least one first through electrodes and the chip selection terminal, and wherein each of the plurality of chip selection lines comprises the third conductor of each of the semiconductor devices.

13. The stacked module of claim 10, further comprising at least one I/O line commonly coupled to the at least one I/O terminal of each of the semiconductor devices, and extended to the bottom of the semiconductor devices.

14. The stacked module of claim 13, wherein each of the semiconductor devices further comprises at least one second through electrode which passes through the at least one I/O terminal and the substrate, and are electrically coupled to the at least one I/O terminal, and wherein the at least one I/O line passes through the at least one second through electrodes.

15. The stacked module of claim 10, wherein each switching element of each of the semiconductor devices comprises a fuse, and the fuse is disconnected after the circuit is tested.

16. A card comprising:
    a memory, the memory comprising:
    a substrate;
    a circuit on the substrate;
    at least one pad on the substrate;
    at least one terminal on the substrate;
    at least one first conductor electrically coupling the at least one pad and the circuit;
    at least one second conductor electrically coupling the at least one terminal and the circuit; and
    at least one switching element connected to the at least one first conductor, the at least one switching element being configured to control electrical signals transmitted between the at least one pad and the circuit;
    at least one first through electrode which passes through the at least one pad and the substrate and is insulated from the at least one pad; and
    a controller configured to control the memory and to send and receive data to and from the memory.

17. The card of claim 16, further comprising:
    a stacked module, comprising:
    a plurality of semiconductor devices each corresponding to a structure of the memory, which are stacked on top of one another; and
    a plurality of chip selection signal lines which are electrically coupled to chip selection terminals from among the at least one terminal of each of the plurality of semiconductor devices, and extended to the bottom of each of the plurality of semiconductor devices.

18. The card of claim 17, wherein the stacked module further comprises at least four semiconductor devices and at least four chip selection signal lines, wherein:
    a first of the at least four semiconductor devices has a first of the at least four chip selection signal lines electrically coupled to a corresponding chip selection terminal of the first semiconductor device;
    a second of the at least four semiconductor devices has a second of the at least four chip selection signal lines electrically coupled to a corresponding chip selection terminal of the second semiconductor device;
    a third of the at least four semiconductor devices has a third of the at least four chip selection signal lines electrically coupled to a corresponding chip selection terminal of the third semiconductor device; and
    a fourth of the at least four semiconductor devices has a fourth of the at least four chip selection signal lines electrically coupled to a corresponding chip selection terminal of the fourth semiconductor device,
    wherein the first chip selection line comprises
      a through electrode which passes through a pad of the first semiconductor device,
      a through electrode which passes through a pad of the second semiconductor device connected to the through electrode which passes through a pad of the first semiconductor device,
      a through electrode which passes through a pad of the third semiconductor device connected to the through electrode which passes through a pad of the second semiconductor device, and a through electrode which passes through a pad of the fourth semiconductor device connected to the through electrode which passes through a pad of the third semiconductor device.

19. A system comprising:
a memory, the memory comprising:
a substrate;
a circuit on the substrate;
at least one pad on the substrate;
at least one terminal on the substrate;
at least one first conductor electrically coupling the at least one pad and the circuit;
at least one second conductor electrically coupling the at least one terminal and the circuit; and
at least one switching element connected to the at least one first conductor, the at least one switching element being configured to control electrical signals transmitted between the at least one pad and the circuit;
at least one first through electrode which passes through the at least one pad and the substrate and is insulated from the at least one pad;

a processor configured to communicate with the memory using a bus; and an I/O device configured to input and output data to and from at least one of the memory and the processor.

20. The card of claim 17, wherein the stacked module further comprises at least first and second semiconductor devices and first and second chip selection signal lines, wherein:

the first semiconductor device has the first chip selection signal line electrically coupled to a corresponding chip selection terminal of the first semiconductor device;

the second semiconductor device has the second chip selection signal line electrically coupled to a corresponding chip selection terminal of the second semiconductor device;

wherein the first chip selection line comprises a through electrode which passes through a pad of the first semiconductor device and a through electrode which passes through a pad of the second semiconductor device connected to the through electrode which passes through a pad of the first semiconductor device.

* * * * *